(12) United States Patent
Yang

(10) Patent No.: US 6,591,400 B1
(45) Date of Patent: Jul. 8, 2003

(54) SYMBOLIC VARIABLE REDUCTION

(75) Inventor: Jin Yang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 36 days.

(21) Appl. No.: 09/675,539

(22) Filed: Sep. 29, 2000

(51) Int. Cl.$^7$ ............................................. G06F 17/50
(52) U.S. Cl. .................... 716/2; 716/2; 716/4
(58) Field of Search ............................. 716/6, 18, 19, 716/4, 5, 2, 13, 15, 7, 16; 395/700

(56) References Cited

U.S. PATENT DOCUMENTS

| | | | |
|---|---|---|---|
| 5,119,318 A | * | 6/1992 | Paradies et al. ............... 706/47 |
| 5,469,367 A | | 11/1995 | Puri et al. |
| 5,481,717 A | * | 1/1996 | Gaboury ..................... 717/126 |
| 5,491,639 A | | 2/1996 | Filkorn |
| 5,594,656 A | | 1/1997 | Tamisier |
| 5,691,925 A | * | 11/1997 | Hardin et al. ................... 703/2 |
| 5,754,454 A | | 5/1998 | Pixley et al. |
| 5,768,498 A | | 6/1998 | Boigelot et al. |
| 5,905,977 A | | 5/1999 | Goubault |
| 5,937,183 A | | 8/1999 | Ashar et al. |
| 6,026,222 A | | 2/2000 | Gupta et al. |
| 6,035,109 A | | 3/2000 | Ashar et al. |
| 6,086,626 A | | 7/2000 | Jain et al. |
| 6,131,078 A | | 10/2000 | Plaisted |
| 6,148,436 A | | 11/2000 | Wohl |
| 6,185,516 B1 | | 2/2001 | Hardin et al. |
| 6,209,120 B1 | | 3/2001 | Kurshan et al. |
| 6,247,165 B1 | | 6/2001 | Wohl et al. |
| 6,292,916 B1 | | 9/2001 | Abramovici et al. |
| 6,301,687 B1 | | 10/2001 | Jain et al. |
| 6,308,299 B1 | | 10/2001 | Burch et al. |
| 6,321,186 B1 | | 11/2001 | Yuan et al. |
| 6,339,837 B1 | | 1/2002 | Li |
| 6,341,367 B1 | * | 1/2002 | Downing ..................... 326/46 |

OTHER PUBLICATIONS

Berezin, S. et al., "A Compositional Proof System for the Modal $\mu$–Calculus and CCS," *Technical Report CMU–CS–97–105, Carnegie Melon University*, Jan. 15, 1997.

Berezin, S. "Model Checking Algorithms for the $\mu$–Calculus," *Technical Report CMU–CS–96–180, Carnegie Mellon University*, Sep. 23, 1996.

Bryant, R. E. et al, "Formal Hardware Verification by Symbolic Ternary Trajectory Evaluation," *$28^{th}$ ACM/IEEE Design Automation Conference*, Paper 24.2, 1991, pp. 397–402.

(List continued on next page.)

*Primary Examiner*—Vuthe Siek
*Assistant Examiner*—Binh Tat
(74) *Attorney, Agent, or Firm*—Blakely, Sokoloff, Taylor & Zafman LLP

(57) ABSTRACT

Methods for formal verification of circuits and other finite-state systems are disclosed herein, providing for improved efficiency and capacity of popular binary decision diagram (BDD) based algorithms. A lazy pre-image computation method is disclosed that builds new transition relation partitions on-demand only for relevant next internal variables of a state predicate. A symbolic variable reduction method is disclosed to eliminate variables in a state predicate under "don't care" conditions. Symbolic variable reduction improves the efficiency for symbolic model checking computations especially lazy pre-image based computations providing means to handle very large-scale integrated circuits and other finite state systems of problematic complexity for prior methods. The teachings of these disclosed methods provide for automated symbolic model checking of circuits and other finite state systems previously too large to be completed successfully using BDD based algorithms.

12 Claims, 11 Drawing Sheets

OTHER PUBLICATIONS

Bryant, R. E., "Binary Decision Diagrams & Beyond," Tutorial at ICCAD '95, *Carnegie Mellon University*, 1995.

Burch, J. R. et al, "Representing Circuits More Efficiently in Symbolic Model Checking," *28th ACM/IEEE Design Automation Conference*, Paper 24,3, 1991, pp. 403–407.

Burch, J. R. et al, "Sequential Circuit Verification Using Symbolic Model Checking," *27th ACM/IEEE Design Automation Conference*, Paper 3.2, 1990, pp. 46–51.

Campos, S.. "Real–Time Symbolic Model Checking for Discrete Time Models," *Technical Report CMU–CS–94–146, Carnegie Mellon University*, Pittsburgh, PA, May 2, 1994.

Chan, W. et al, Combining Constraint Solving and Symbolic Model Checking for a Class of Systems with Non–linear Constraints, *Computer Aided Verification, 9th International Conference, CAV '97 Proceedings* (O. Grumberg, Editor), Lecture Notes in Computer Science 1254, pp. 316–327, Haifa, Israel, Jun. 1997. Springer–Verlag (Revised in Dec. '98).

Chen, Y. et al, "PHBD: An Efficient Graph Representation for Floating Point Circuit Verification," *Technical Report CMU–CS–97–134, Carnegie Mellon University*, May 1997.

Cheung, S. et al, "Checking Safety Properties Using Compositonal Reachability Analysis," *ACM Transactions on Software Engineering and Methodology*, vol. 8, No. 1, Jan. 1999, pp. 49–78.

Chiodo, M. et al, "Automatic Compositional Minimization in CTL Model Checking," *Proceedings of 1992 IEEE/ACM International Conference on Computer–Aided Design*, Nov., 1992, pp. 172–178.

Chou, C., "The Mathematical Foundation of Symbolic Trajectory Evaluation," *International Conference on Computer–Aided Verification*(CAV'99), Trento, Italy, Jul. 1999 pp. 196–207, Proceedings of CAV'99, Lecture Notes in Computer Science #1633 (Editors: Nicolas Halbwachs & Doron Peled), Springer–Verlog, 1999.

Clarke, E. et al, "Another Look at LTL Model Checking," *Technical Report CMU–CS–94–114, Carnegie Mellon University*, Feb. 23, 1994.

Clarke, E. et al, "Combining Symbolic Computation and Theorem Proving: Some Problems of Ramanujan," *Technical Report CMU–CS–94–103, Carnegie Mellon University*, Jan. 1994.

Clarke, E. M. et al, "Formal Methods: State of the Art and Future Directions,"*ACM Computing Surveys*, vol. 28, No. 4, Dec. 1996, pp. 626–643.

Clarke, E. M. et al, "Model Checking and Abstraction," *Proceedings of the 19th ACM SIGPLAN–SIGACT Symposium on Principles of Programming Languages*, Feb. 1992, pp. 343–354.

Clarke, E. M. et al, "Model Checking and Abstraction," *ACM Transactions on Programming Languages and Systems*, vol. 16, No. 5, Sep. 1994, pp. 1512–1542.

Grumberg, O., "Model Checking and Modular Verification," *ACM Transactions On Programming Languages and Systems*, vol. 16, No. 3, May 1994, pp. 843–871.

Jackson, D., "Exploiting Symmetry in the Model Checking of Relational Specifications," *Technical Report CMU–CS 94–219, Carnegie Mellon University*, Dec. 1994.

Jain, A. et al, "Verifying nondeterministic Implementations of Determinist Systems," *Lecture Notes in Computer Science, Formal Methods in Computer Aided–Design*, pp. 109–125, Nov. 1996.

Jain, A., "Formal Hardware Verification by Symbolic Trajectory Evaluation," *Carnegie Mellon University, Ph.D. Dissertation*, Jul. 1997.

Jain, S. et al, "Automatic Clock Abstraction from Sequential Circuits," *Proceedings of the 32nd ACM/IEE Conference on Design Automation*, Jan. 1995.

Jha, S. et al, "Equivalence Checking Using Abstract BBDs," *Technical Report CMU–CS–96–187, Carnegie Mellon University*, Pittsburgh, PA, Oct. 29, 1996.

Kern, C. et al, "Formal Veriification In Hardware Design: A Survey," *ACM Transactions on Design Automation of Electronic Systems*, vol. 4, No. 2, Apr. 1999, pp. 123–193.

Kurshan, R. et al, "Verifying Hardware in its Software Context," *Proceedings of the 19th ACM SIGPLAN–SIGACT Symposium on Principles of Programming Languages*, Feb. 1992, pp. 742–749.

Nelson, K. L. et al, "Formal Verification of a Superscalar Execution Unit," *34th Design Automation Conference*, Jun. 1997.

Tuya, J. et al, "Using a Symbolic Model Checker for Verify Safety Properties in SA/RT Models," *Proceeding of the 5h European Software Engineering Conference, Lecture Notes in Computer Science*, vol. 989, Springer–Verlag, Berlin, 1995, pp. 59–75.

Velev, M. N., "Efficient Modeling of Memory Arrays in Symbolic Simulations," *Proceedings of Computer–Aided Verification*, Jun. 1997.

Wing, J. M. et al, "A Case Study in Model Checking Software Systems," *Technical Report CMU–CS–96–124, Carnegie Mellon University*, Pittsburgh, PA, Apr. 1996.

Yeh, W. et al, "Compositional Reachability Analysis Using Process Algebra," *28th ACM/IEEE Design Automation Conference*, 1991.

\* cited by examiner

FIG. 4b

| # of transitions | Front | Transition Relation | Lazy Pre-image | Reachable |
|---|---|---|---|---|
| 0 | e | [ ] |  | e<br><br>420 |
| 1 | c AND NOT e | [ N(e) = e OR c ] | e OR c | e OR c<br><br>421 |
| 2 | ∅ | [ N(e) = e OR c<br>N(c) = c AND a ] | (c AND a) AND NOT (e OR c) | e OR c<br><br>422 |

FIG. 5b

| # of transitions | Front | Transition Relation | Lazy Pre-image | Reachable |
|---|---|---|---|---|
| 0 | e | [ ] |  | e<br><br>520 |
| 1 | c | [ N(e) = e OR c ] | e OR c | e OR c<br><br>521 |
| 2 | ∅ | [ N(e) = e OR c<br>N(c) = c AND a ] | c AND a | e OR c<br><br>522 |

SYMBOLIC VARIABLE REDUCTION

FIELD OF THE INVENTION

This invention relates generally to automated design verification, and in particular to more efficient use of binary decision diagrams to perform automated symbolic model checking for very large scale integrated circuit designs and other finite state systems.

BACKGROUND OF THE INVENTION

Modern design of very large-scale integrated circuits often involves years of research and the efforts-of hundreds of engineers. Automated formal verification methods are an essential part of the design effort, reducing errors, lost time and risk to financial investment.

As the size and complexity of designs increase, much effort is expended to improve the efficiency of automated formal verification methods. One technique used in symbolic model checking to improve efficiency is to employ binary decision diagrams (BDDs). A BDD is a directed acyclic graph that represents a Boolean expression. For each Boolean variable, there are two outgoing edges representing true or false assignments to the variable. The use of BDDs permits computation times, which are, for many practical cases, some polynomial function of the number of expression variables. Alternative representations such as clauses or truth tables require execution times, which are some exponential function of the number of expression variables. Therefore, use of BDDs has been popular in the formal verification community since the late 1980's. BDDs, however, are not without drawbacks. The ordering of variables is critical to an efficient use of BDDs. Poor variable ordering can increase a BDDs size and cause exponential execution times. One method for symbolic model checking using BDDs comes from Carnegie Mellon University and is known as Symbolic Model Verifier (SMV).

Alternatively SMV uses a well known heuristic based procedure named simplify_assuming that is aimed at reducing BDD representations by simplifying a predicate but may frequently leave variables in the representation that are unnecessary.

Over the years, techniques have been developed to improve performance and capacity of BDD-based algorithms. One technique is called Cone of Influence (COI) reduction. In COI reduction, an abstraction is built for a circuit model consisting of next state functions only for variables in the dependency closure of variables of interest in the circuit specification. One drawback is that all variables in the dependency closure do not necessarily influence the variables of interest in the circuit specification. A second drawback is that the abstraction that is built and used for each model-checking step may include portions that are useful in only a few of the model checking steps. Therefore needless extra computations are potentially performed, resulting in little benefit to the circuit verification.

Some methods have attempted to improve upon COI reduction by starting from a small portion of the dependency closure and extending the portion only when model checking fails to produce a satisfactory result. But these techniques also perform unnecessary computations on portions that are not relevant to the particular model-checking step being performed.

One method called the bounded cone of influence (BCOI) was proposed by A. Biere et al for symbolic model checking without BDDs [A. Biere, E. Clark, R. Raimi, and Y. Zhu; Verifying safety properties of a PowerPC™ microprocessor using symbolic model checking without BDDs; CAV'99; 1999]. However, even the BCOI method potentially includes irrelevant variables in the abstraction it builds, and the technique is not applicable to improve the widely used BDD-based approaches.

BRIEF DESCRIPTION OF THE DRAWINGS

The present invention is illustrated by way of example and not limitation in the figures of the accompanying drawings.

FIG. 4b shows an example of a lazy fixpoint computation for a circuit.

FIG. 5b shows another example of a lazy fixpoint computation for a circuit using both lazy pre-image computations and symbolic variable reduction.

DETAILED DESCRIPTION

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Methods for formal verification of circuits and other finite-state systems are disclosed herein, providing for improved efficiency and capacity of popular binary decision diagram (BDD) based algorithms. For one embodiment of a lazy pre-image computation, a method is disclosed that builds new transition relation partitions on-demand only for relevant next internal variables of a state predicate, and conjoins only next state relations for relevant next internal variables to a pre-image including the state predicate. For one embodiment of a symbolic variable reduction technique, a method is disclosed that improves the efficiency for symbolic model checking computations especially lazy pre-image based computations providing means to handle very large scale integrated circuits and other finite state systems of problematic complexity for prior methods. For one embodiment of a lazy fixpoint computation, a method is disclosed that makes iterative use of lazy pre-image computation and symbolic variable reduction to compute conditions that necessarily must be satisfied to produce a given set of states. The teachings of these disclosed methods provide for symbolic model checking of circuits and other finite state systems previously too large to be completed successfully using BDD based algorithms.

Figure 1:
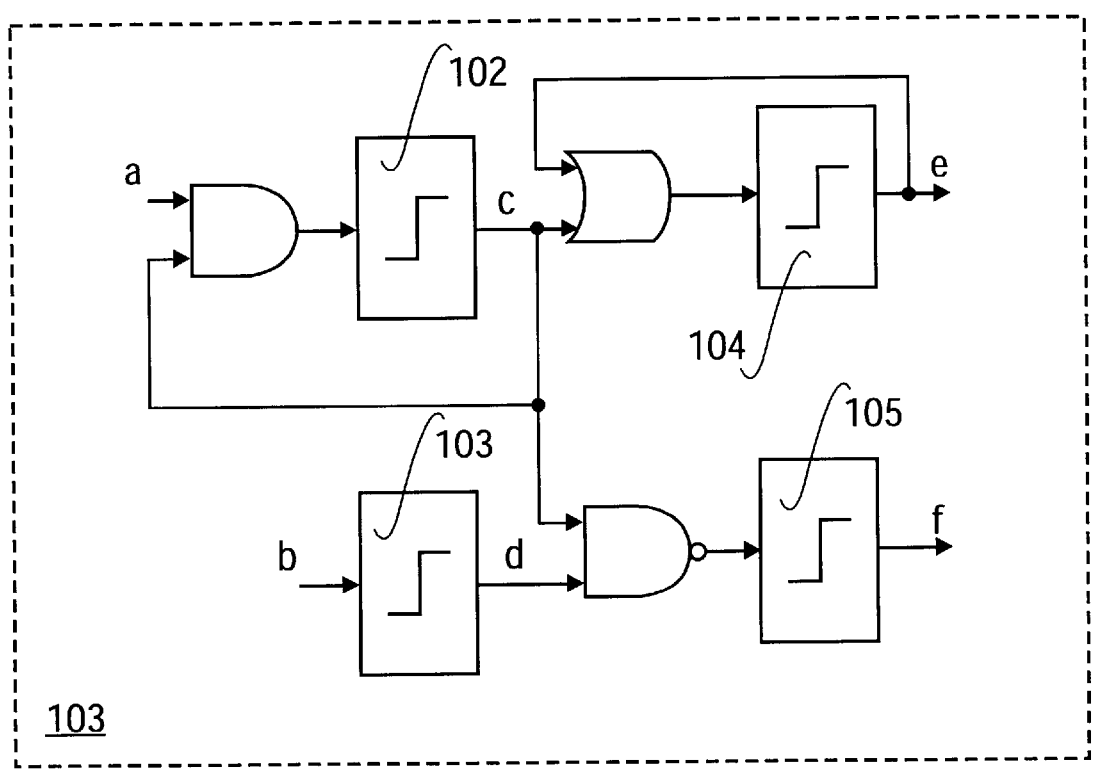
FIG. 1 illustrates an example of a circuit.

FIG. 1 illustrates an example of a circuit 101 having internal state variables c, d, e and f; and input variables a and b. According to the logical combination of inputs to memory element 102, the value of internal state variable c at its next transition can be determined to be the value of the Boolean expression a AND c. From the logical combination of inputs to memory element 103, the value of internal state variable d at its next transition can be determined to be the value of the input variable b. From the logical combination of inputs to memory element 104, the value of internal state variable e at its next transition can be determined to be the value of the Boolean expression c OR e. Finally, from the logical combination of inputs to memory element 105, the value of internal state variable f at its next transition can be determined to be the value of the Boolean expression c NAND d.

A model of a circuit or other finite state system can be formally defined as: a nonempty finite set of Boolean variables, $V=V_S \cup V_I$, consisting of a union V of internal state variables $V_S$ with input variables $V_I$; and a next state function N(v) for each v in $V_S$, which is an assignment mapping of internal state variables according to Boolean (true or false) valued expressions on V. A partitioned transition relation, R, on a partitioning of the internal state variables {V1, V2, . . . , Vk} has the implicitly conjoined form:

$$R(V, V') = R1(V,V1') \text{ AND } R2(V,V2') \ldots \text{ AND } Rk(V,Vk')$$

where the ith partition is $Ri(V,Vi') = AND_{for\ all\ v'\ in\ Vi'}(v'=N(v))$. The assertion v'=N(v) is called the next state relation for v and v' is a copy of v to record the value taken on by v at the next transition.

A set of states, S, may be represented using a Boolean state predicate S(V). Operations on sets may be carried out as algebraic manipulations of state predicates. The set of states that can move to S in one transition is called the pre-image of S and written $$Pre(S(V)) = \exists V'.[AND_{for\ all\ v'\ in\ Vs'}(v'=N(v)) \text{ AND } S(V')].$$

An existential operation ∃V'.[S(V')] represents a quantification of state predicate S(V') over the variables in V'. Typically, in order to more efficiently use computation resources, the operation of computing the pre-image of a set of states is carried out as a relation product of state predicates using early variable quantification for partitioned transition relations, thereby permitting staged reductions of Boolean expressions, as follows:

$$Pre(S(V)) = \exists V1' \cdot [R1(V, V1') \text{ AND } ($$
$$\exists V2' \cdot [R2(V, V2') \text{ AND } ($$
$$\ldots$$
$$\exists Vk \cdot [Rk(V, Vk') \text{ AND } ($$
$$\exists Vl' \cdot S(V')\ )]$$
$$\ldots\ )]$$
$$)].$$

One drawback of a typical pre-image computation is that it involves the entire partitioned transition relation. But S(V) may involve only a few variables.

Consequently, not all next state relations are relevant in any particular invocation of a pre-image computation.

Figure 2A:
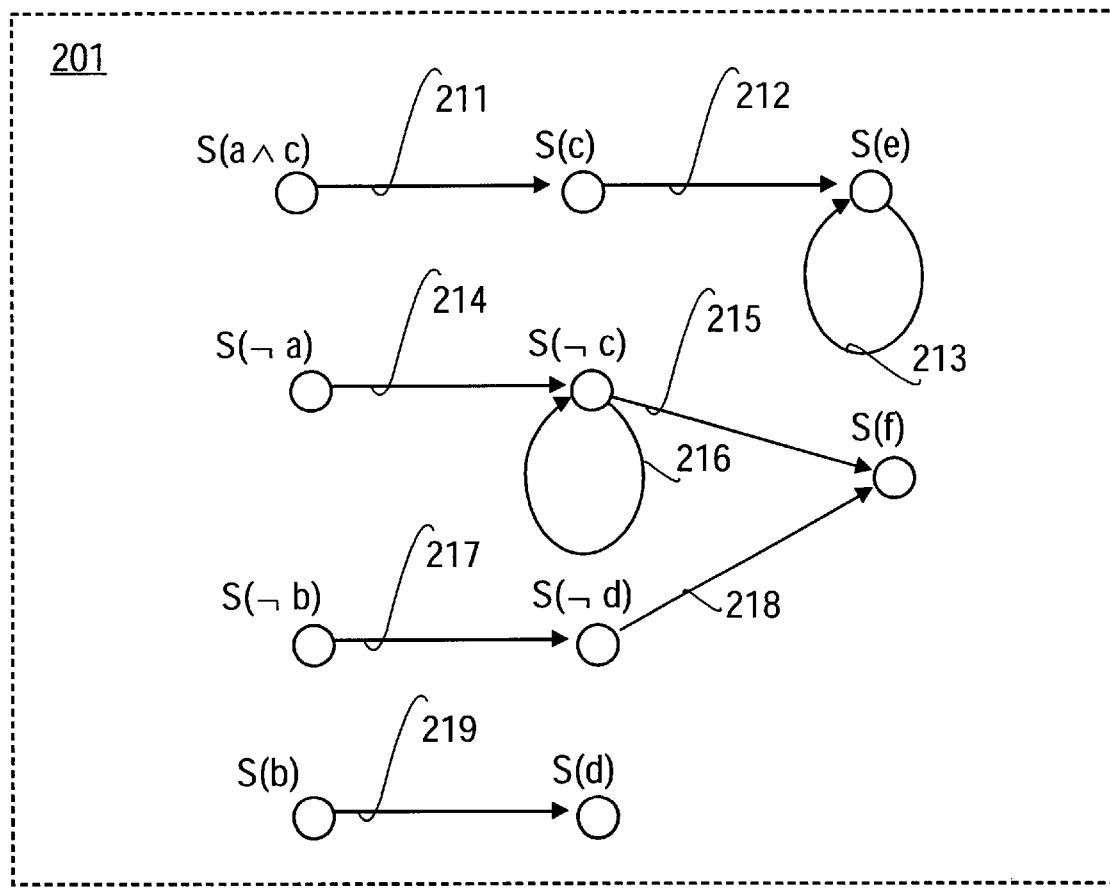
FIG. 2a graphically illustrates a transition relation for a circuit.

For example, FIG. 2a graphically illustrates a possible transition relation 201 for circuit 101 having $V_S$={c, d, e, f} and $V_I$={a, b}. The next state function for variable c is N(c)=a AND c. Therefore, in order for the circuit to reach a state, S(c), where c=1 it must have made transition 211 from a state S(a AND c) where a=1 and c=1. The next state function for variable d is N(d)=b. Therefore, in order for the circuit to reach a state, S(d), where d=1 it must have made transition 219 from a state S(b) where b=1. The next state function for variable e is N(e)=e OR c. Therefore, in order for the circuit to reach a state, S(e), where e=1 it must have made transition 212 from a state S(c) where c=1 or it must have made transition 213 from a state S(e) where e=1. The next state function for variable f is N(f)=d NAND c. Therefore, in order for the circuit to reach a state, S(f), where f=1 it must have made transition 215 from a state S(NOT c) where c=0 or it must have made transition 218 from a state S(NOT d) where d=0.

Computing all states reachable to S(e) in two or more transitions includes the next state function for variable c, which has already been shown as N(c)=a AND c represented by transition 211. The next state function for variable NOT c is N(NOT c)=NOT(a AND c)=(NOT a) OR (NOT c). Therefore, in order for the circuit 101 to reach a state, S(NOT c), where c=0 it must have made transition 214 from a state S(NOT a) where a=0 or it must have made transition 216 from a state S(NOT c) where c=0. The next state function for variable NOT d is N(NOT d)=NOT b. Therefore, in order for the circuit to reach a state, S(NOT d), where d=0 it must have made transition 217 from a state S(NOT b) where b=0.

For a given state predicate, an invocation of a pre-image computation that uses transition relation 201 may result in computations that are not relevant to that state predicate. For one embodiment, a lazy pre-image computation is disclosed which provides a relevant transition relation abstraction for each pre-image computation according to the state predicate of the invocation. Such a lazy pre-image computation may be performed for a state predicate S(W), where W is contained in V and $W_S'$ is the set of next internal variables in the set of next variables W', as follows:

$$Pre(S(W)) = \exists W'.[AND_{for\ all\ v'\ in\ Ws'}(v'=N(v)) \text{ AND } S(W')].$$

The approach provided by the lazy pre-image computation disclosed above differs from previous COI reduction approaches in that it is not statically derived from a model specification and then used throughout. Instead, it dynamically provides an abstraction for each pre-image computation that is relevant to the particular state predicate associated with the invocation. Accordingly, lazy pre-image computation provides for greater efficiency and capacity improvements in popular BDD-based symbolic model checking methods than previously used pre-image computation methods.

For example, the lazy pre-image of a state predicate S(e) for circuit 101 where e=1 can be computed:

$$Pre(S(e)) = \exists e' \cdot [(e' = N(e)) \text{ AND } S(e')].$$
$$= \exists e' \cdot [(e' = e \text{ OR } c) \text{ AND } e'].$$
$$= (e \text{ OR } c).$$

Figure 2B:
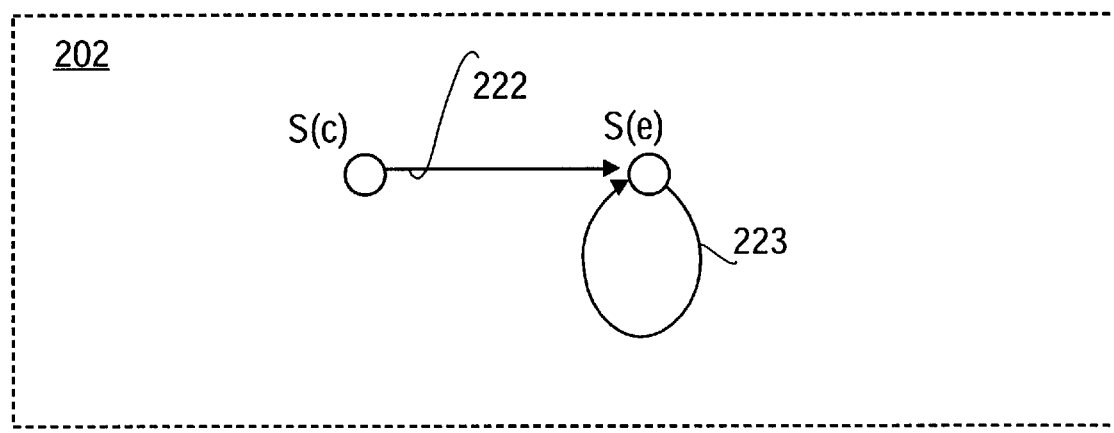
FIG. 2b shows another transition relation built as part of a lazy pre-image computation.

FIG. 2b graphically illustrates a possible transition relation 202 for circuit 101 built as a result of an invocation of the lazy pre-image computation Pre(S(e)) on the state predicate S(e) where e=1. The next state function for variable e is N(e)=e OR c. Therefore, in order for the circuit to reach a state, S(e), where e=1 it must have made transition 222 from a state S(c) where c=1 or it must have made transition 223 from a state S(e) where e=1. Since no other transitions are relevant to reaching state S(e), the lazy pre-image method need not build them. As seen in the above example, this lazy pre-image method potentially reduces the number of transition relation partitions involved and also the sizes of partitions. Therefore computations required to explicitly build a BDD for a desired function may be significantly reduced.

Figure 3A:
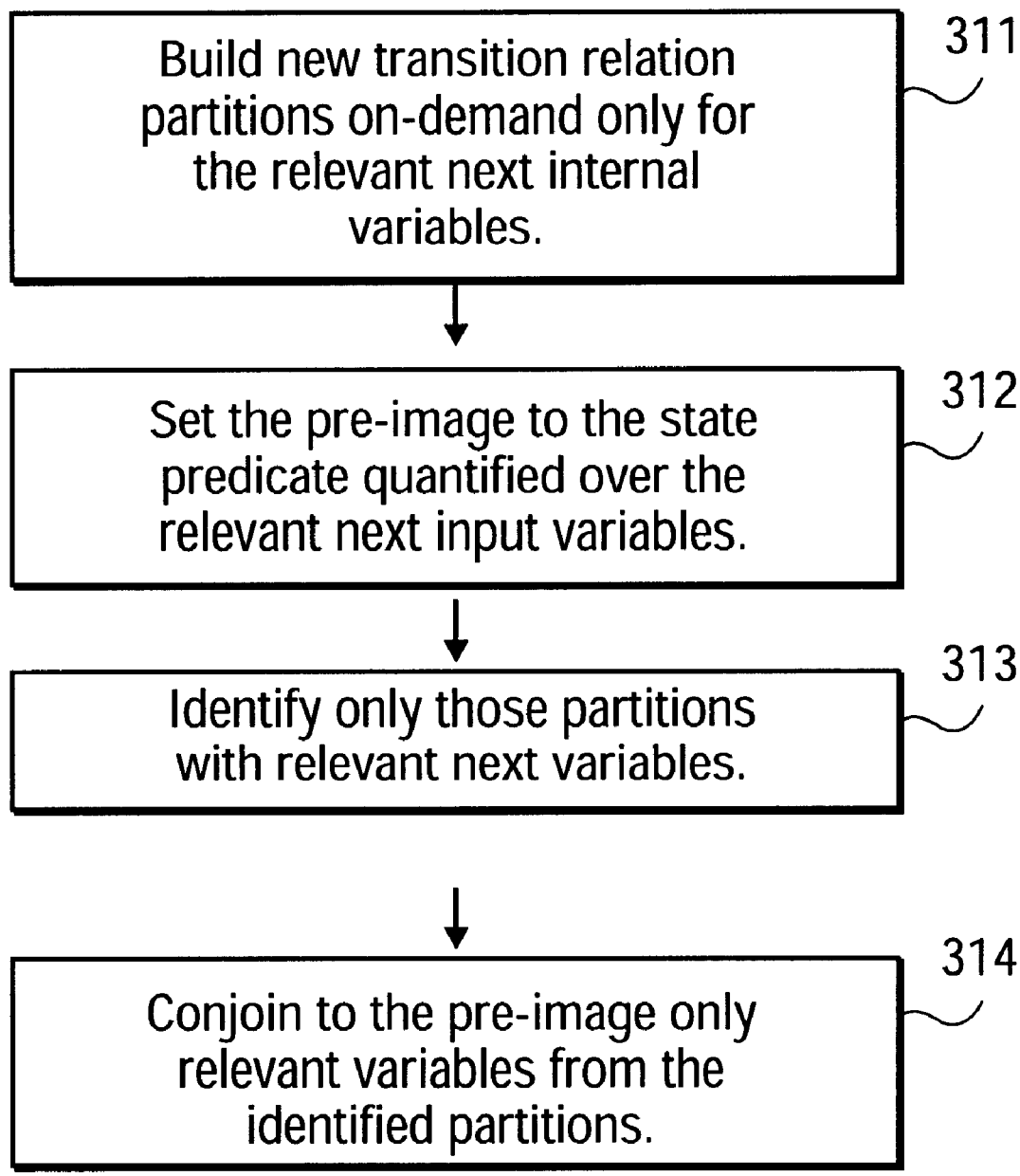
FIG. 3a illustrates one embodiment of a method for performing lazy pre-image computations.

For one embodiment, FIG. 3a illustrates performing a lazy pre-image computation. In processing block 311 transition relation partitions are updated as needed by adding new transition relations for only the relevant next internal variables. In processing block 312 a pre-image is initialized to the next state predicate of the invocation and existentially quantified over the relevant next input variables. In processing block 313, partitions with relevant next variables are identified. Finally in processing block 314, next state relations for relevant variables from the partitions identified in processing block 313 are conjoined to the pre-image and quantified.

The lazy pre-image method disclosed above provides for greater efficiency and capacity for symbolic model checking operations, particularly on circuits with a large number of variables. In a BDD based implementation, building transition relation partitions only as needed and only for relevant next internal variables is especially beneficial since the next state function for an internal variable is efficiently and implicitly encoded, but a BDD for the function must be explicitly built for symbolic model checking. Explicitly building BDDs unnecessarily may become computationally expensive.

Figure 3B:
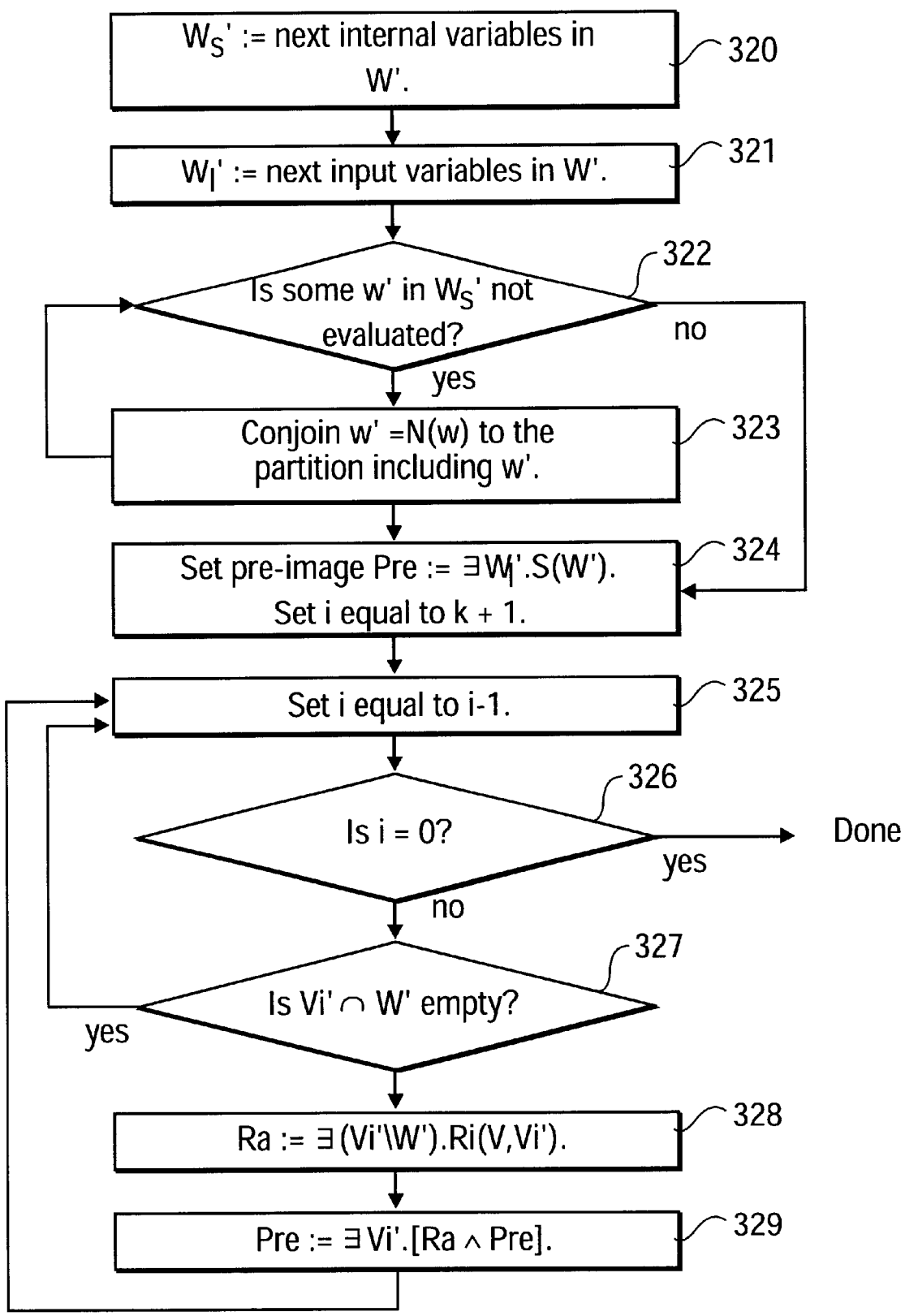
FIG. 3b illustrates one embodiment of a more detailed method for performing lazy pre-image computations.

FIG. 3b details one embodiment of a method for performing a lazy pre-image computation on a state predicate S(W) involving a set W of internal variables and input variables. In processing block 320, $W_S$ is initialized to be the set of next internal variables in W'. In processing block 321, $W_I'$ is initialized to be the set of next input variables in W'. In processing block 322, the next internal variables are checked to identify some variable w' that has not been evaluated. If one is identified, w'=N(w) is conjoined to the partition including w' and flow returns to processing block 322 to look for more next variables that have not been evaluated. Thus the transition relation partitions are built as needed for the relevant next internal variables. When no more are found, flow proceeds at processing block 324. In processing block 324 the pre-image is initialized to the state predicate existentially quantified for the relevant next input variables and partition counter i is set to k+1. In processing block 325, i is decremented. Then in processing block 326, partition counter i is tested to see if it has reached zero. If partition counter i has not reached zero, in processing block 327 partition Vi' is checked against W' to identify relevant variables. If no relevant variables are found, partition Vi' is skipped and flow proceeds at processing block 325. Otherwise in processing block 328, all next variables in Vi' that are not in W' are existentially quantified out from partition Vi' and the remaining relevant variables are evaluated according to their next state relations and assigned to Ra. Then in processing block 329, Ra is conjoined with the pre-image Pre and flow proceeds with the next i at processing block 325. When i=0 indicating no more partitions remain at processing block 326, the processing terminates and pre-image Pre is complete.

In one embodiment, the lazy pre-image computation disclosed above provides for potential improvements in key model checking techniques. For example one embodiment of a lazy pre-image method provides an efficient general operation that may also be used effectively in performing fixpoint computations.

Figure 4A:
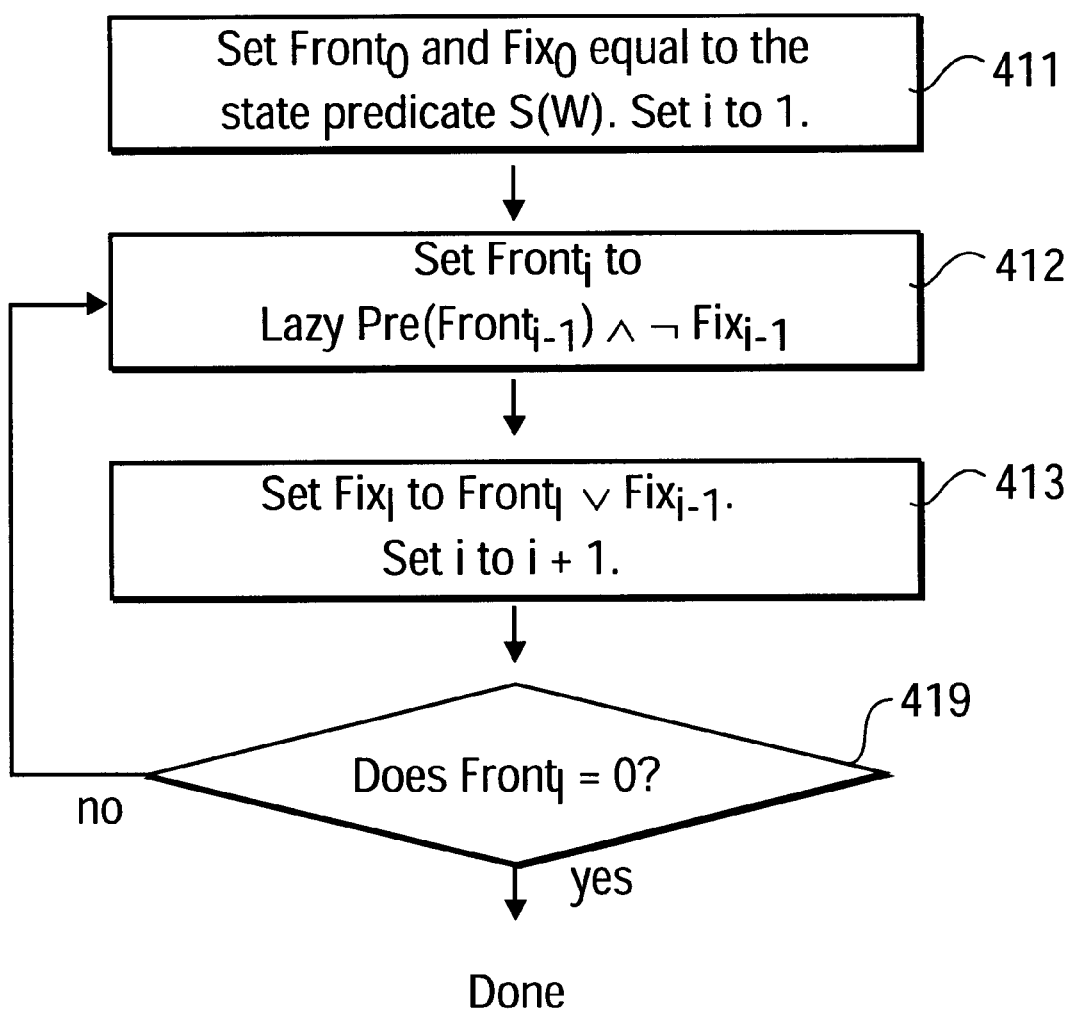
FIG. 4a illustrates one embodiment of a method for computing a fixpoint using lazy pre-image computations.

FIG. 4a illustrates one embodiment of a fixpoint computation method which uses lazy pre-image computations. In processing block 411, a partial fixpoint state predicate, $Fix_0$, and an initial frontier predicate, $Front_0$, are both set to the input predicate S(W), and counter i is initialized to 1. In processing block 412, the new frontier predicate, Fronts, is set to the lazy pre-image of the previous frontier predicate, $Front_{i-1}$, intersected with the negated partial fixpoint predicate, $\neg Fix_{i-1}$, in order to exclude any states whose pre-images have already been computed. This computation is expressed symbolically as $Pre(Front_{i-1}) \land \neg Fix_{i-1}$. In processing block 413 a new fixpoint predicate $Fix_i$ is set to the union of the new frontier predicate, $Front_i$, and the previous partial fixpoint predicate, $Fix_{i-1}$. Counter i is then incremented. In processing block 419, $Front_i$ is tested to see if any states from the previous iteration that need to have pre-images computed remain in the frontier. If so, processing beginning at processing block 412 repeats until $Front_i$ is emptied of such states, in which case processing terminates at processing block 419.

FIG. 4b illustrates an example of one embodiment of performing a lazy fixpoint computation for state predicate, S(e), where e=1, on circuit 101. The fixpoint $Fix_0$ predicate 420 for the states reachable to S(e) in zero transitions and the frontier $Front_0$ are initially set to e. Since no pre-image computation is required, no transition relation is built. To compute the fixpoint $Fix_1$ predicate 421 for the states reachable to S(e) in one transition a lazy pre-image of the frontier predicate $Front_0$ is computed and combined with NOT $Fix_0$. Since frontier predicate $Front_0$ only involves signal e, lazy transition relation building only computes a transition relation partition for e, as [N(e)=e OR c]. Lazy pre-image Pre(S(e)) can be computed as previously shown, and the lazy pre-image computation returns e OR c based on the partially computed transition relation. The new frontier predicate $Front_1$ is set to (e OR c) AND NOT e in accordance with processing block 412, which reduces to c AND NOT e. Fixpoint $Fix_1$ predicate 421 for states reachable to S(e) in one transition is set to (c AND NOT e) OR e, which becomes e OR c.

To compute the fixpoint $Fix_2$ predicate 422 for those states reachable to S(e) in two transitions, the lazy pre-image of the frontier predicate $Front_1$ is computed and combined with NOT $Fix_1$. The pre-image is calculated as follows:

Pre(c AND NOT e)=∃e', c'.[(e'=N(e)) AND (c'=N(c)) AND S(e', c')].=∃e', c'.[(e'=e OR c) AND (c'=c AND a) AND (c' AND NOT e')].=(c AND a) AND NOT (e OR c).

Alternatively, since Pre(e) has already been computed, what needs to be computed is Pre(c). It will be appreciated that reduction of frontier variables can be an extremely useful operation, providing for improved efficiency in each iteration. A frontier reduction may be accomplished through use of a symbolic variable reduction technique prior to computing the subsequent pre-image so that the pre-image computation may be performed on a smaller predicate. This symbolic variable reduction technique is below disclosed in greater detail.

Predicate (c AND NOT e) requires lazy transition relation building of the translation relation partition for c, as [N(c)=c AND a]. Lazy pre-image computation returns (c AND a) AND NOT (e OR c) based on the partially computed transition relation. The new frontier predicate $Front_2$ is set to (c AND a) AND NOT (e OR c) in accordance with processing block 412, which reduces to (c AND a AND NOT e AND NOT c)=0. Fixpoint $Fix_2$ Predicate 422 for states reachable to S(e) in two transitions becomes just (e OR c).

Since frontier predicate $Front_2$=0 the lazy fixpoint computation terminates. The transition relations for b, d and f are not needed and therefore they are not built.

It will be appreciated that the operations performed in processing block 412 may cause the number of variables in the frontier predicate $Front_i$ to grow, thereby causing the lazy pre-image computation to be less effective. Therefore, it is again desirable to reduce the number of variables in $Front_i$ through use of symbolic variable reduction. Herein, details of one embodiment of a symbolic variable reduction technique will be disclosed.

If, for example, at each iteration, $Front_i$ could be replaced by a simplified frontier predicate, $Front_i'$, having fewer variables than $Front_i$, such that the simplified frontier predicate implicates the partial fixpoint predicate (i.e. $Front_i'$ ⇒ $Fix_i$) and such that the original frontier predicate implicates the simplified frontier predicate (i.e. $Front_i$ ⇒ $Front_i'$), then the efficiency of the lazy pre-image computation in the subsequent iteration could be improved. Hence, the overall efficiency of the fixpoint computation could also be improved. It will be appreciated that the first condition ($Front_i'$ ⇒ $Fix_i$) may be expressed in an equivalent logical form as ($Front_i'$ AND NOT $Fix_i$=0). Since it is known that ($Front_i$ AND NOT $Fix_i$=0), it is possible to derive some conditions for which a "don't care" variable may be eliminated from $Front_i'$.

If there is a variable v in $Front_i$ but not in NOT $Fix_i$ then v may be eliminated from $Front_i'$ by existential quantification. This can be expressed as follows:

[(∃v.$Front_i$) AND NOT $Fix_i$=0] for any v in $Front_i$ but not in NOT $Fix_i$.

If there is a variable v in $Front_i$ and also in NOT $Fix_i$ then v may be eliminated from $Front_i'$ if the intersection of both predicates is empty after v is assigned opposite Boolean values in the two predicates. This can be expressed as follows:

[(∃v.$Front_i$) AND NOT $Fix_i$=0]⇔[($Front_i$[1/v] AND NOT $Fix_i$[0/v]=0) AND ($Front_i$[0/v] AND NOT $Fix_i$[1/v]=0)].

If there is a variable w in $Front_i$ such that for any variable v in NOT $Fix_1$ the intersection of the two predicates is empty for all assignments to v, then w may be eliminated from $Front_i'$ by existential quantification. This can be expressed as follows:

[(∃w.$Front_i$) AND NOT $Fix_i$=0]⇔[(∃w.$Front_i$) AND (NOT $Fix_i$[0/v]=0)] AND

[(∃w.$Front_i$) AND (NOT $Fix_i$[1/v]=0)].

Figure 5A:
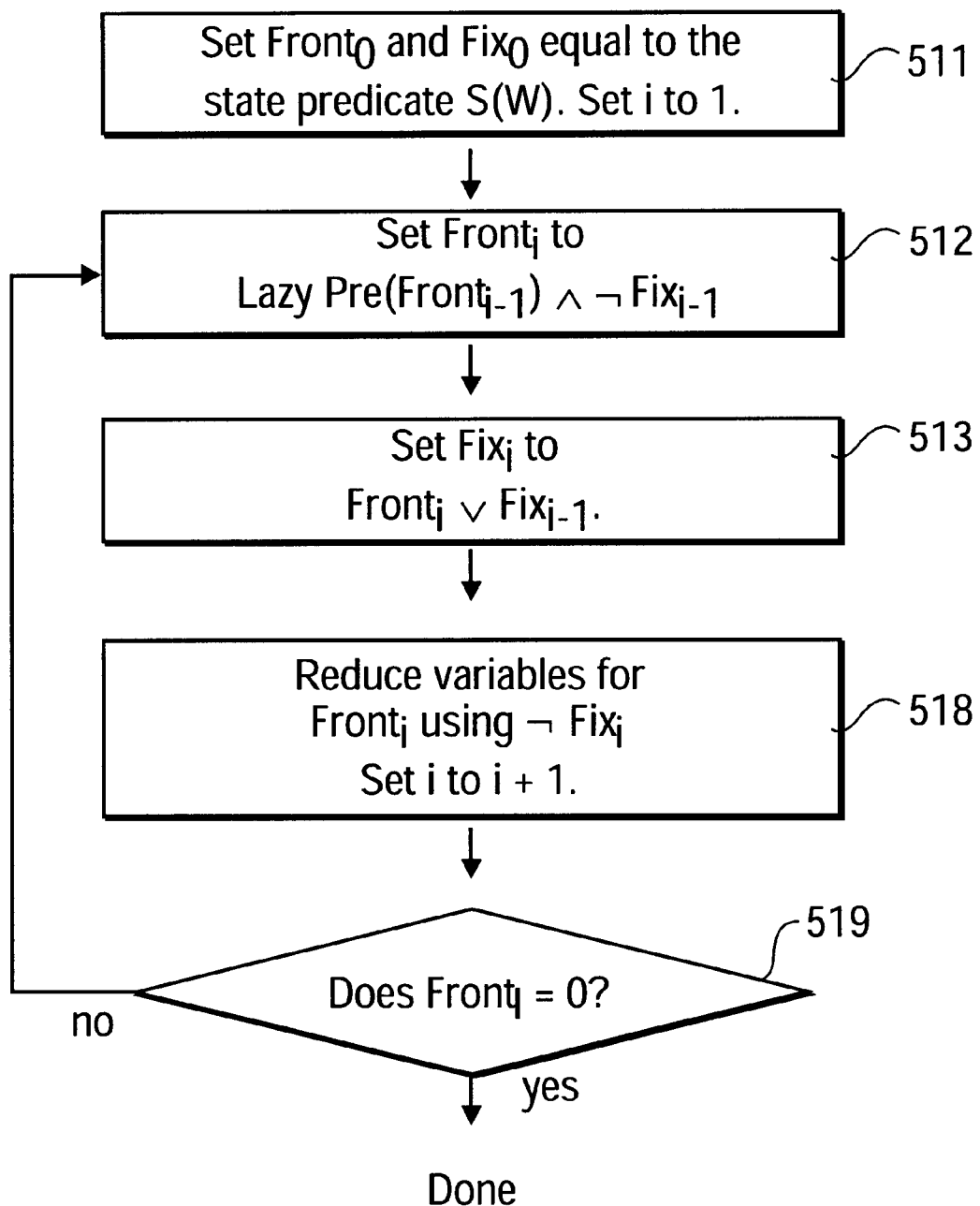
FIG. 5a illustrates another embodiment of a method for computing a fixpoint using both lazy pre-image computations and symbolic variable reduction.

FIG. 5a illustrates one embodiment of an improved fixpoint computation method which uses lazy pre-image computations and a symbolic variable reduction technique according to the observations disclosed above. In processing block 511, a partial fixpoint state predicate, $Fix_0$, and an initial frontier predicate, $Front_0$, are both set to S(W), and counter i is initialized to 1. In processing block 512, the new frontier predicate, $Front_i$, is set to the lazy pre-image of the previous frontier predicate, $Front_{i-1}$, intersected with the negated partial fixpoint predicate, ¬$Fix_{i-1}$, in order to exclude any states whose pre-images have already been computed. This computation is expressed symbolically as Pre($Front_{i-1}$) ∧¬$Fix_{i-1}$. In processing block 513 a new fixpoint predicate $Fix_i$ is set to the union of the new frontier predicate, $Front_1$, and the previous partial fixpoint predicate, $Fix_{i-1}$, which may be seen as expressing conditions for reduction of "don't care" variables. In processing block 518, the variables in frontier predicate, $Front_i$, are reduced according to the above disclosed conditions with respect to the negated partial fixpoint predicate, ¬$Fix_i$. Counter i is then incremented. In processing block 519, $Front_i$ is tested to see if any states that need to have pre-images computed remain in the frontier. If so, processing beginning at processing block 512 repeats until $Front_i$ is emptied of such states, in which case processing terminates at processing block 519.

FIG. 5b illustrates an example of one embodiment of performing a lazy fixpoint computation using a symbolic variable reduction technique for state predicate, S(e), where e=1, on circuit 101. The fixpoint, $Fix_0$ predicate 520 for the states reachable to S(e) in zero transitions and the frontier Front are initially set to e. Since no pre-image computation is required, no transition relation is built. To compute the fixpoint $Fix_1$ predicate 521 for the states reachable to S(e) in one transition a lazy pre-image of the frontier predicate $Front_0$ is computed and combined with NOT $Fix_0$. Since frontier predicate $Front_0$ only involves signal e, lazy transition relation building only computes a transition relation partition for e, as [N(e)=e OR c]. A lazy pre-image Pre(S(e)) can be computed as previously shown, and the lazy pre-image computation returns e OR c based on the partially computed transition relation. The new frontier predicate Front, is set to (e OR c) AND NOT e in accordance with processing block 512, which reduces to c AND NOT e. Fixpoint $Fix_1$ predicate 521 for states reachable to S(e) in one transition is set to (c AND NOT e) OR e, which becomes e OR c.

This time, in accordance with processing block 518 the variables may be reduced for $Front_1$=(c AND NOT e) using NOT $Fix_1$=NOT(e OR c). Since the variable e appears in both predicates, the following conditions are checked:

($Front_1$[1/e] AND NOT $Fix_1$[0/e])=(c AND NOT 1) AND NOT(0 OR c)=0 AND NOT c=0.

AND ($Front_1$[0/e] AND NOT $Fix_1$[1/e]=0)

(c AND NOT 0) AND NOT(1 OR c)=c AND NOT 1=0.

Accordingly, the frontier predicate Front, may be reduced to c. To compute the fixpoint $Fix_2$ predicate 522 for those states reachable to S(e) in two transitions, the lazy pre-image of the reduced frontier predicate Front, is computed and combined with NOT $Fix_1$. The pre-image is calculated as follows:

$$Pre(c) = \exists c' \cdot [(c' = N(c)) \text{ AND } S(c')]$$
$$= \exists c' \cdot [(c' = c \text{ AND } a) \text{ AND } (c')].$$
$$= (c \text{ AND } a).$$

The predicate c requires lazy transition relation building of the translation relation partition for c, as [N(c)=c AND a]. Lazy pre-image computation returns (c AND a) based on the partially computed transition relation. The new frontier predicate $Front_2$ is set to (c AND a) AND NOT (e OR c) in accordance with processing block 512, which reduces to (c AND a AND NOT e AND NOT c)=0. Fixpoint $Fix_2$ Predicate 522 for states reachable to S(e) in two transitions becomes just (e OR c).

Since frontier predicate $Front_2$=0 the lazy fixpoint computation terminates. The transition relations for b, d and f are not needed and therefore they are not built and the number of variables in the frontier are reduced by a symbolic variable reduction technique further providing reduced computational complexity and storage requirements for the lazy pre-image computations.

Figure 6A:
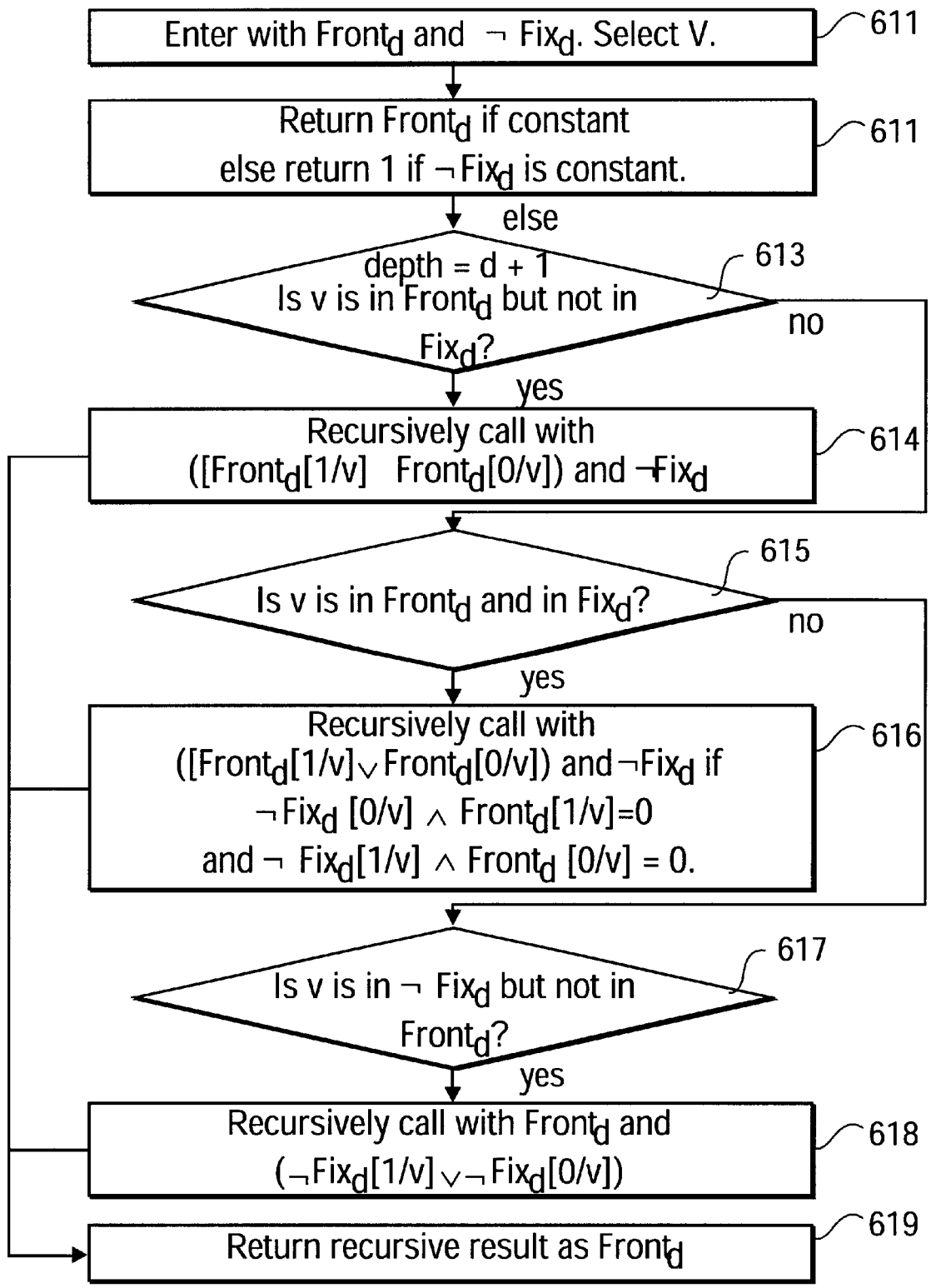
FIG. 6a illustrates one embodiment of a detailed method for performing symbolic variable reduction.

FIG. 6a illustrates a more detailed method for one embodiment of a symbolic variable reduction computation according to a set of conditions with respect to a frontier predicate and a negated partial fixpoint predicate as disclosed above.

In processing block 611, the recursive method entry point, the negated partial fixpoint predicate is NOT $Fix_d$, and frontier predicate is $Front_i$. A variable v is selected from the variables in NOT $Fix_d$, or $Front_d$. In processing block 612, the recursive method terminates if $Front_d$ is constant, returning $Front_d$ as a result, or if NOT $Fix_d$ is constant, returning 1 as a result. In processing block 613 the recursive depth is increased to d+1. If v is in frontier predicate, $Front_d$, but not in negated partial fixpoint predicate, NOT $Fix_d$, then processing proceeds to processing block 614 where v is eliminated from $Front_d$ by making a recursive call with arguments ($Front_d[1/v]$ OR $Front_d[0/v]$) and NOT $Fix_d$. Otherwise processing proceeds to processing block 615.

In processing block 615, if v is in frontier predicate, $Front_d$, and also in negated partial fixpoint predicate, NOT $Fix_d$, then processing proceeds to processing block 616 where v may be eliminated from $Front_d$ by making a recursive call with arguments ($Front_d[1/v]$ OR $Front_d[0/v]$) and NOT $Fix_d$ if the intersection of NOT $Fix_d[0/v]$ when v set to zero (or false) and $Front_d[1/v]$ when v set to one (or true) and the intersection of NOT $Fix_d[1/v]$ when v set to one (or true) and $Front_d[0/v]$ when v set to zero (or false) are both empty. Otherwise processing proceeds in processing block 617.

In processing block 617, if v is in negated partial fixpoint predicate, NOT $Fix_d$, but not in frontier predicate, $Front_d$, then processing proceeds to processing block 618 where another variable w is eliminated from $Front_d$ if the intersection of $Front_d$ with NOT $Fix_d[1/v]$ when v set to one (or true) and also with NOT $Fix_d[0/v]$ when v set to zero (or false) are both empty by making a recursive call with arguments $Front_d$ and (NOT $Fix_d[1/v]$ OR NOT $Fix_d[0/v]$). Upon return from a recursive call processing block 619, the result is returned as $Front_d$.

It will be appreciated that the recursive method of FIG. 6a may also be performed as an iterative method. It will also be appreciated that previously computed results may be stored, for example in a hash table, to further reduce recursive computations.

Figure 6B:
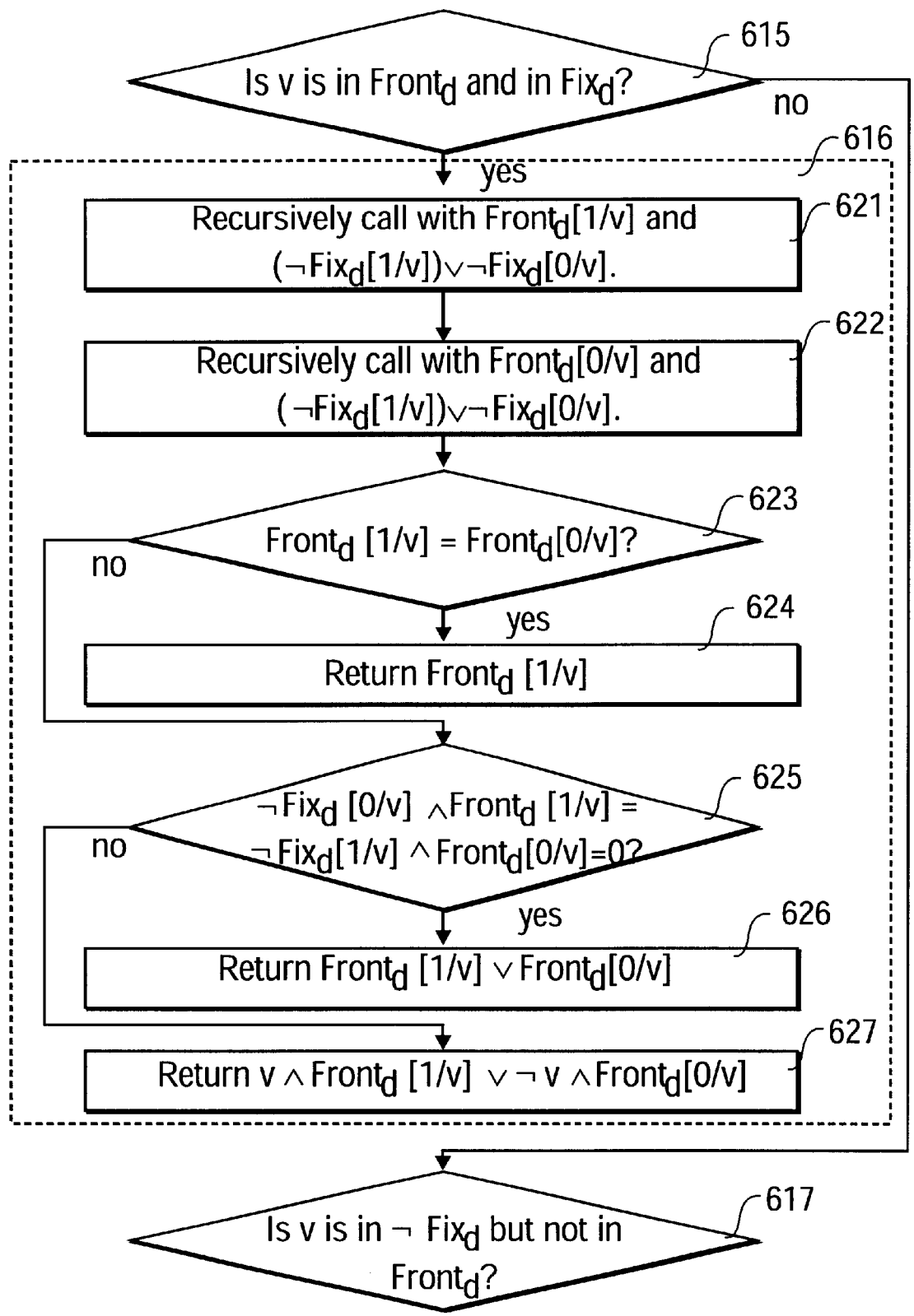
FIG. 6b shows one embodiment of a more detailed method for performing symbolic variable reduction.

FIG. 6b shows in detail, one alternative embodiment of the symbolic variable reduction of processing block 616. In processing block 615, if v is in frontier predicate, $Front_d$, and also in negated partial fixpoint predicate, NOT $Fix_d$, then processing proceeds to processing block 621. Otherwise processing proceeds in processing block 617.

In processing block 621, it is understood that v may be eliminated from $Front_d$ if the intersection of NOT $Fix_d[1/v]$ when v set to zero (or false) and $Front_d[1/v]$ when v set to one (or true) and the intersection of NOT $Fix_d[1/v]$ when v set to one (or true) and $Front_d[0/v]$ when v set to zero (or false) are both empty. To accomplish this, a first recursive call is made with arguments $Front_d[1/v]$ and (NOT $Fix_d[1/v]$ OR NOT $Fix_d[0/v]$). Processing then proceeds to processing block 622 where a second recursive call is made with arguments $Front_d[0/v]$ and (NOT $Fix_d[1/v]$ OR NOT $Fix_d[0/v]$). Upon return from the recursion processing proceeds in processing block 623 where the two results $Front_d[1/v]$ and $Front_d[0/v]$ are tested for equality. If they are found to be equal then processing terminates in processing block 624 and the result $Front_d[1/v]$ may be returned. Otherwise processing proceeds in processing block 625 where the two intersections NOT $Fix_d[0/v]$ AND $Front_d[1/v]$ and NOT $Fix_d[1/v]$ AND $Front_d[0/v]$ are checked. If they are both empty then processing terminates in processing block 626 and the result ($Front_d[1/v]$ OR $Front_d[0/v]$) may be returned. Otherwise processing terminates in processing block 627 and the result ((v AND $Front_d[1/v]$) OR (NOT v AND $Front_d[0/v]$)) may be returned.

The above symbolic variable reduction method is illustrated by way of example and not limitation. The method may also be applicable to any reduction of variables in a predicate P under a don't care condition Q by solving a symbolic variable reduction with the arguments P and NOT(P OR Q).

It will be appreciated that the methods herein disclosed or methods substantially similar to those herein disclosed may be implemented in one of many programming languages for performing automated computations including but not limited to lazy pre-image computations, symbolic variable reduction, lazy fixpoint computations using symbolic variable reduction, and lazy model checking using symbolic variable reduction on high-speed computing devices.

Figure 7:
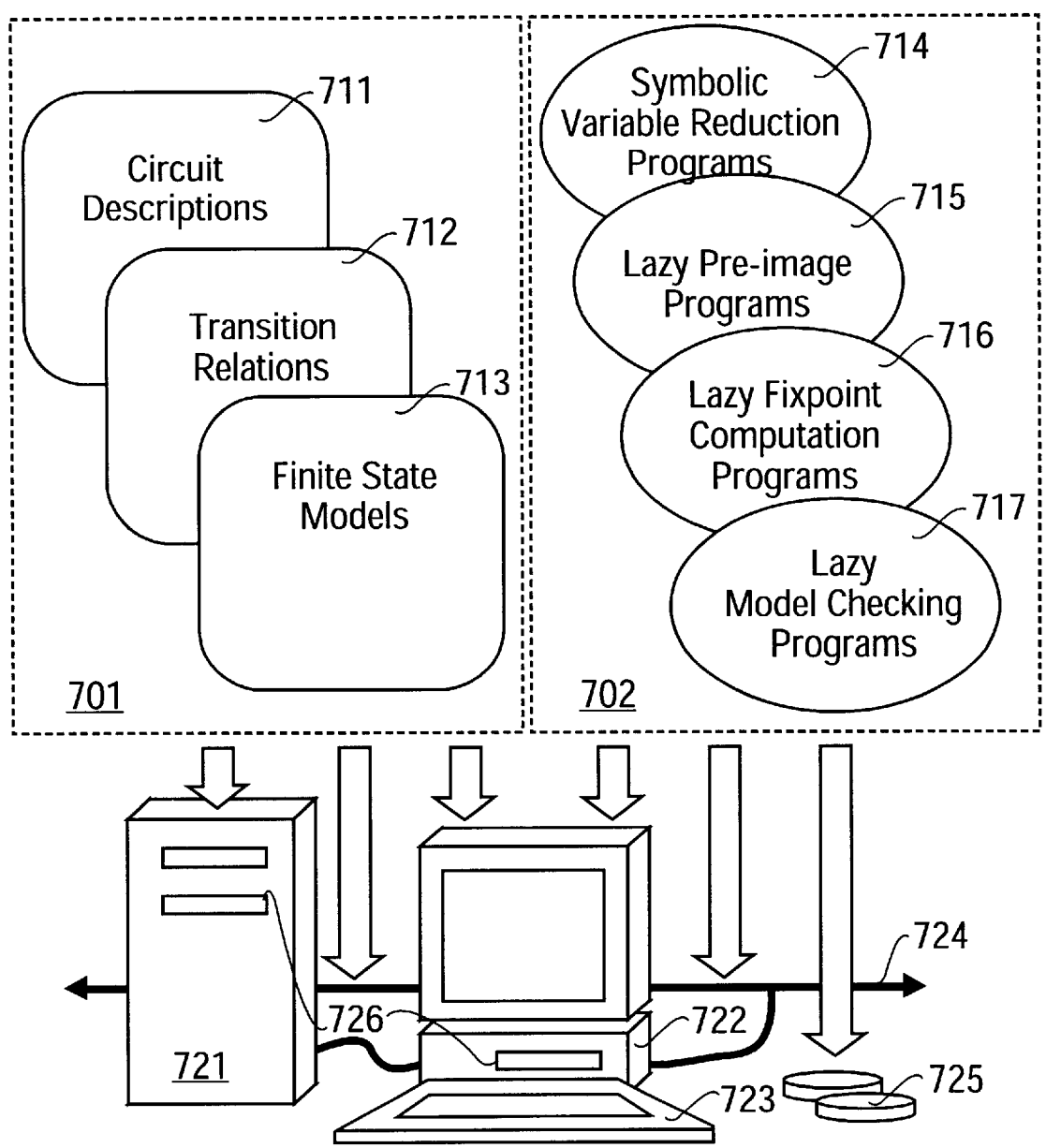
FIG. 7 depicts a computing system for automated lazy symbolic model checking of finite state systems using symbolic variable reduction.

For example, FIG. 7 illustrates a computer system to perform computations, for one such embodiment. Processing device 722 is connectable with various recordable storage media, transmission media and I/O devices to receive data structures and programmed methods. Representative data structures 701 may include circuit descriptions 711, transition relations 712, and finite state models 713. Representative programmed methods 702 may include symbolic variable reduction programs 714, lazy pre-image programs 715, lazy fixpoint computation programs 716, and model checking programs 717. Components of either or both of the data structures and programmed methods may be stored or transmitted on recordable media such as removable storage disks 725, which may be accessed through an access device 726 in processing device 722 or in a storage serving system 721. Storage serving system 721 or processing device 722 may also include other removable storage media or non-removable storage media suitable for storing or transmitting data structures 701 or programmed methods 702. Component data structures and programmed methods may also be stored or transmitted on transmission media such as network 724 for access by processing device 722 or entered by users through I/O device 723. It will be appreciated that systems such as the one illustrated are commonly available and widely used in the art of designing finite state hardware and software systems. It will also be appreciated that the complexity, capabilities, and physical forms of such design systems improves and changes rapidly, and therefore understood that the design system illustrated is by way of example and not limitation.

The above description is intended to illustrate preferred embodiments of the present invention. From the discussion above it should also be apparent that the invention can be modified in arrangement and detail by those skilled in the art without departing from the principles of the present invention within the scope of the accompanying claims.

What is claimed is:

1. A computer software product having one or more recordable medium having executable instructions stored thereon which, when executed by a processing device, causes the processing device to:

eliminate a variable in a state predicate under a don't care condition by a symbolic variable reduction having a first argument involving the state predicate and a second argument involving a union of the state predicate and the don't care condition.

2. The computer software product recited in claim 1 wherein the second argument is a negated union of the state predicate and the don't care condition.

3. The computer software product recited in claim 1 wherein, a first value is substituted for the variable the first argument.

4. The computer software product recited in claim 1 wherein, a constant value is substituted for the variable in the second argument.

5. The computer software product recited in claim 1 which, when executed by a processing device, further causes the processing device to:

identify the variable as being in the first argument and not in the second argument.

6. The computer software product recited in claim 1 which, when executed by a processing device, further causes the processing device to:

identify the variable as being in the first argument and in the second argument;

substitute a first value for the variable in the first argument and substitute a second value for the variable in the second argument form an intersection of the first argument having the first value substituted for the variable with the second argument having the second value substituted for the variable and check if the intersection is empty.

7. The computer software product recited in claim 1 which, when executed by a processing device, further causes the processing device to:

identify a second variable as being not in the first argument but in the second argument;

eliminate the second variable in the second argument;

form an intersection of the first argument with the second argument having the second variable eliminated; and check if the intersection is empty.

8. A computer software product having one or more recordable medium having executable instructions stored thereon which, when executed by a processing device, causes the processing device to:

receive a first argument and a second argument;

if a first variable can be identified that is in the first argument and is not in the second argument, eliminate the first variable from the first argument;

else if a second variable can be identified that is in the first argument and in the second argument, substitute a first value and a second value for the second variable in the first argument and for the second variable in the second argument, form a first intersection of the first argument having the first value substituted for the second variable with the second argument having the second value substituted for the second variable, form a second intersection of the first argument having the second value substituted for the second variable with the second argument having the first value substituted for the second variable, and if the first intersection and the second intersection are empty, eliminate the second variable from the first argument;

else if a third variable can be identified that is in the second argument and is not in the first argument, eliminate the third variable in the second argument, form an intersection of the first argument with the second argument having the third variable eliminated, and if the intersection is empty, eliminate a fourth variable from the first argument.

9. The computer software product recited in claim 8 wherein the first value represents a logical true value and the second value represents a logical false value.

10. A method comprising:

identifying a first variable of a state predicate, P, under a condition predicate, Q, such that a reduced state predicate, P', exists that does not include the first variable and satisfies the relation:

$$(P \rightarrow P') \text{ AND } (P' \rightarrow (P \text{ OR } Q)); \text{ and}$$

producing the state predicate, P', by eliminating the first variable from the state predicate, P.

11. A method comprising:

receiving a first argument and a second argument;

eliminating the first variable from the first argument if a first variable can be identified that is in the first argument and is not in the second argument;

else if a second variable can be identified that is in the first argument and in the second argument, substituting a first value and a second value for the second variable in the first argument and for the second variable in the second argument, forming a first intersection of the first argument having the first value substituted for the second variable with the second argument having the second value substituted for the second variable, forming a second intersection of the first argument having the second value substituted for the second variable with the second argument having the first value substituted for the second variable, and eliminating the second variable from the first argument if the first intersection and the second intersection are empty;

else if a third variable can be identified that is in the second argument and is not in the first argument, eliminating the third variable in the second argument, forming an intersection of the first argument with the second argument having the third variable eliminated, and eliminate a fourth variable from the first argument if the intersection is empty.

12. The method recited in claim 11 wherein the first value represents a logical true value and the second value represents a logical false value.

\* \* \* \* \*